United States Patent [19]

Iwase et al.

[11] Patent Number: 4,649,412

[45] Date of Patent: Mar. 10, 1987

[54] READ ONLY SEMICONDUCTOR MEMORY DEVICE WITH POLYSILICON DRAIN EXTENSIONS

[75] Inventors: Taira Iwase, Kawasaki; Shoji Ariizumi, Tokyo; Fujio Masuoka, Yokohama, all of Japan

[73] Assignee: Kabushiki Kaisha Toshiba, Kawasaki, Japan

[21] Appl. No.: 674,999

[22] Filed: Nov. 27, 1984

[30] Foreign Application Priority Data

Nov. 29, 1983 [JP] Japan .................. 58-224921

[51] Int. Cl.⁴ ............ H01L 29/78; H01L 27/04; G11C 11/40
[52] U.S. Cl. .................. 357/41; 357/23.9; 357/23.12; 357/59; 357/71; 365/104; 148/DIG. 82
[58] Field of Search ........ 357/59, 71 R, 71 S, 357/71 P, 23.9, 41, 23.12; 365/104

[56] References Cited

U.S. PATENT DOCUMENTS 4,193,125  3/1980  Moriya ........................... 365/104
4,240,097 12/1980  Raymond, Jr. .................... 357/59
4,558,343 12/1985  Ariizumi et al. ................... 357/59

FOREIGN PATENT DOCUMENTS 56-147473 11/1981 Japan .
56-144572 11/1981 Japan .

OTHER PUBLICATIONS

"Late Implant Turns ROMs Around Fast," Electronics, May 31, 1983, pp. 50–51.

Primary Examiner—William D. Larkins
Attorney, Agent, or Firm—Finnegan, Henderson, Farabow, Garrett & Dunner

[57] ABSTRACT

A semiconductor memory device is formed of a polycrystalline silicon electrode terminal layer, which is formed on a MOS transistor except over the gate region and is connected to the drain region of the MOS transistor, and metal wire layer, which is formed on the MOS transistor except over the gate region and is connected to the electrode terminal layer to transmit output signals. Data is written into the semiconductor memory device by ion implantation of the gate of the MOS transistor after the metal wire layer is formed.

6 Claims, 14 Drawing Figures

READ ONLY SEMICONDUCTOR MEMORY DEVICE WITH POLYSILICON DRAIN EXTENSIONS

BACKGROUND OF THE INVENTION

This invention relates to an improvement in the memory elements of a read only memory and the method of manufacturing the same.

Read only memories in which information is written in during the wafer manufacturing stage are generally known as mask programmable ROMs. Some prior art methods of writting data into a mask programmable ROM are (1) the contact method, (2) the field oxide film method, (3) the threshold voltage method. In the contact method, logical 1 or logical 0 is written in depending on whether or not the output signal line (bit line) and the drain of the memory cell transistor are connected. In the field oxide film method, data is written in depending upon whether a gate oxide film or a field oxide film is formed on the gate region of the memory cell transistor. Namely, when a gate oxide film is formed, the memory cell transistor is turned ON and OFF by the gate voltage and, when a field oxide film is formed, the transistor is always OFF. Data is written in by these changes in the state of the memory cell transistors. In the threshold voltage method, data is written in by varying the threshold voltage Vth of the memory cells by varying the density of the impurities in the gate region of the memory cell transistor.

FIG. 1 shows an expanded plan view of part of a memory using the threshold voltage method. FIG. 1 shows the positional relationship of the individual parts, and parts not required are omitted to facilitate the illustration. In this case, the memory cells are N channel type MOS transistors, and the description is of one of the memory cells of a pair of memory cells that share a common drain. The memory cell 1, shown by a one-dot broken line, is formed of a gate 3, drain 5, source 7, polycrystalline silicon gate electrode 9 and aluminum wire layer 11 (bit line) that crosses the gate electrode 9 at right angles. The Al wire layer 11 is connected to the drain 5 by contact 13. Memory cell 1 is isolated from the contiguous memory cells by the P type isolation region 15. Source 7 is connected in common to the sources of the contiguous memory cells by N+ type regions 17, and is kept at ground level, for example.

The above prior art methods, however, have the following drawbacks. In the contact method, one contact is required for each memory cell so the memory cell is larger than those of the other methods. In the field oxide film method, data is written into the memory cell in the initial stage of wafer manufacturing so the turnaround time is long. In the threshold voltage method, on the other hand, the turnaround time is comparatively short and the memory cells are comparatively small so this method has come to be widely used. As was disclosed in "Late implant turns ROMs around fast" in ELECTRONICS, May, 1983, p50, ion implantation of the gate region of the memory cell after the formation of the Al wire has been developed. With this method it is possible to form a mask programmable ROM with very short turnaround time. Also, before data is written into the ROM, it is possible to check the characteristics of the memory cell transistors so it is possible to estimate the yield. With this method, because ion implantation is performed after the Al wire is formed, it is not possible to place it over the gate region of the memory cell and, accordingly, the planar structure of the memory cell is as shown in FIG. 2. FIG. 3 shows a cross section along the arrowed line I—I of the memory cell shown in FIG. 2. In both FIGS. 2 and 3, unrelated parts have been omitted to facilitate illustration of the positional relationship. For the purpose of illustration the memory cells are taken to be N channel MOS transistors of which one is described. The one-dot broken line shows memory cell 21, which is constructed of gate 25 formed in the P type semiconductor substrate 23, drain 27, source 29, insulation film 31, polycrystalline silicon gate electrode 33 (word line) formed over the gate 25 with insulation film 31 therebetween, and Al wire layer 37 (bit line), which is formed across gate electrode 33 at right angles and insulated therefrom by an insulation layer 35. Al wire layer 37 protrudes above drain 27 and this protrusion is connected to drain 27 by contact 39. This memory cell 21 is isolated from other elements by a P type isolation region 41. The source 29 is connected to the sources of memory cells contiguous to it by N type regions 43, and maintained at ground level, for example. For convenience of explanation, description of the passivation layer has been omitted.

However, with the construction shown in FIGS. 2 and 3, the Al wire layer 37 contacts drain 27 and must be provided so as to avoid overlapping gate 25. A gap must be maintained such that Al wire 37 does not short other Al wires and the width of the Al wire 37 must be sufficient to prevent severing of the wires during manufacturing. Also, contact 39 cannot be made too small because of manufacturing restrictions and because the contact resistance must be kept to a certain limit. Further, the portion protruding over drain 27 of Al wire 37 must have sufficient size to cover contact 39. Accordingly, the size of the memory cell 21 in the direction of the gate electrode 33 is determined by the width of Al wire 37 and the size of the gap, and the size of contact 39. This means that the transistor of this kind of memory cell is comparatively large and, consequently, it has been impossible to increase the degree of integration of the memory cells (having a structure such as that shown in FIG. 2) using the prior art threshold voltage method. The yield also is low, the cost prohibitive.and the delay in the word line direction long.

SUMMARY OF THE INVENTION

In consideration of the above facts, it is the purpose of this invention to provide a high integration semiconductor memory in a read only memory device and a manufacturing method by ion implantation of the gate region after the formation of the Al wire (bit line).

The read only memory device of this invention is a MOS transistor formed with a conductive electrode terminal layer, which is electrically connected to the drain region of the MOS transistor but does not overlap the gate region of the MOS transistor, and a metal wire layer, which does not overlay the gate region of the MOS transistor, and which is connected to the electrode terminal layer and transmits output signals.

With this kind of construction, the electrode terminal layer and the metal wire layer are not above the gate of the MOS transistor and, accordingly, it is possible to write data into the memory cell transistor by ion implanting the gate region after the metal wire layer has been formed. It is also possible to make the contact resistance between the MOS transistor drain and the electrode terminal layer smaller than was possible in the prior art. Accordingly, the contact area between the drain and the electrode terminal layer can be decreased, with in turn means that the area of the memory cell can be decreased. Also, the size of the memory cell is not limited by the gap between the protrusion of a metal wire layer and the neighboring metal wire layer so the area of the memory cell can be made still smaller than the prior art. For the reasons given above, it is possible to reduce the area of the memory cell transistor by 80% and increase the degree of integration by 1.25. Also, because the chip size is small, the yield is improved. Generally, in integrated circuits, the smaller the chip, the better the yield because the possibility of locating a random defect in the wafer decreases with the decrease in the size of the chip. This invention decreases the size of the chip so it can be said to increase the yield. It is also possible to make the contact area between the electrode terminal layer and the metal wire layer, except for the region above the gate, sufficiently wide. As was explained above, the contact resistance between the drain and the electrode terminal layer can be made small so the total contact resistance can be made smaller than in the prior art, and deterioration in the characteristics of the memory cell transistor due to contact resistance can be decreased. The result, then, is a read only memory semiconductor device with good yield at high density, which in turn means a device with good characteristics and good economics.

DETAILED DESCRIPTION OF THE PREFERRED EMBODIMENT

The following is a description of one embodiment of the invention taken in conjunction with FIGS. 4 to 9B.

Figure 4:
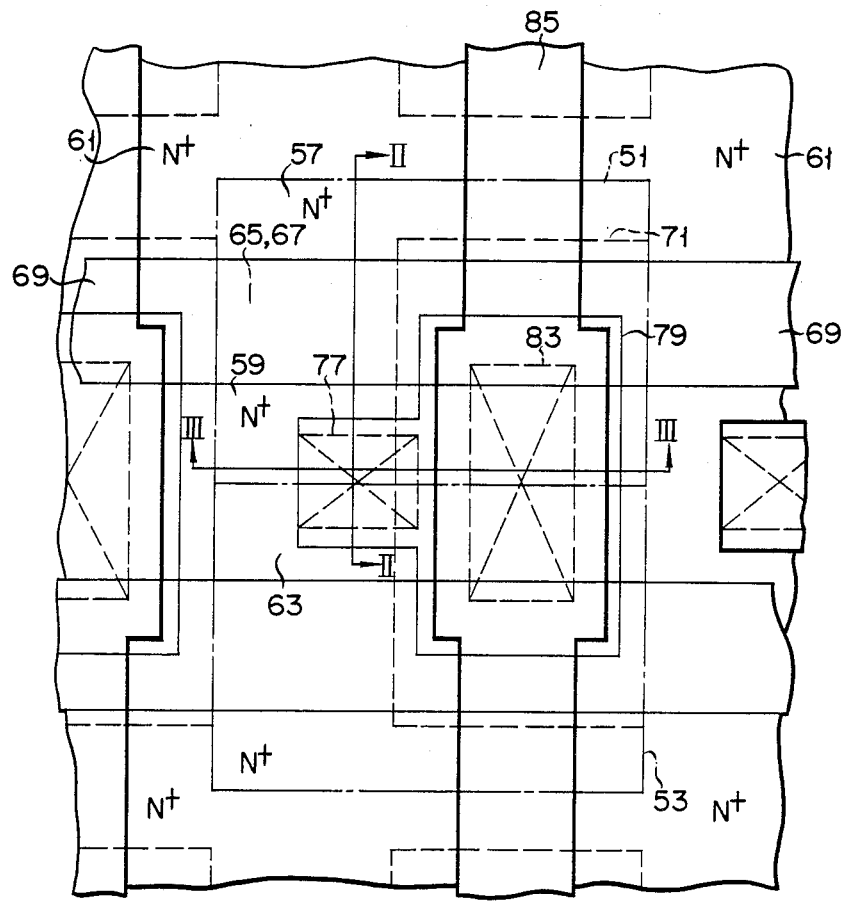
FIG. 4 is a plan view of the first embodiment of this invention.

For the purpose of explanation, the memory cell transistors are taken to be N channel MOS transistors. As is shown in FIG. 4, this semiconductor memory device is comprised of a plurality of memory cells arranged in a matrix. As is the case in the prior art as well, the memory cells are arranged in pairs of contiguous cells in the vertical direction of the drawing (hereinafter referred to as the bit line direction). The drains of each pair of memory cells are formed as one and the memory cells are formed symmetrically in the drawing with the drain in the center. The source of each memory cell is connected to the source of the cell contiguous to it, and is maintained at ground level. For convenience of explanation, of the pair of memory cells 51, 53 shown by a one dot broken line only memory cell 51 will be described.

An N+ type source 57 and N+ type drain 59 are formed inside the P type semiconductor substrate 55. As was explained earlier, the source 57 is connected to the sources of the contiguous memory cells by an N type region 61. The drain 59 is formed as one with the drain 63 of the memory cell 53. The P type region between the source 57 and drain 59 is the gate region 65. A gate oxide film 67 is formed on this gate region 65, and a polycrystalline gate electrode 69 (word line) is formed on the gate oxide film 67. The field oxide film 71 shown by the broken line in FIG. 4 is formed in the element isolation region to isolate the elements. A silicon oxide film 73 is formed on the element region and another silicon oxide film 75 is formed over the whole wafer surface of the semiconductor. A square contact hole 77 is formed in the silicon oxide layers 73, 75 on the drain 59. A polycrystalline silicon electrode terminal layer 79, which does not overlap the gate region 65, is formed on the insulation layer filling contact hole 77. The electrode terminal layer 79, as shown in FIG. 4, extends over drain 59 and has a contact portion which contacts drain 59. A silicon oxide film 81 is formed covering the electrode terminal layer 79 and the silicon oxide film 75. A square contact hole 83 is formed in a prescribed position of the silicon oxide film 81 on the electrode terminal layer 79. This contact hole 83 is filled, the electrode terminal layer 79 is contacted, and gate electrode 69 is crossed, while avoiding overlapping gate 65, by Al wire layer 85. This Al layer 85 is in electrical contact with drain 59 through electrical terminal layer 79 for the transmission of the output signals of the memory cell. Impurities are ion implanted in gate 65 as necessary to vary the threshold voltage of the MOS transistor for writting in data.

The following is a description of the manufacturing method of the above semiconductor memory device in conjunction with FIGS. 4 to 9B. FIGS. 6A, 7A, 8A and 9A are cross sections along the line II—II of the device shown in FIG. 4 in one of the manufacturing stages. FIGS. 6B, 7B, 8B and 9B are cross sections along the line III—III of the device in the same manufacturing stage as above.

Figure 6A:
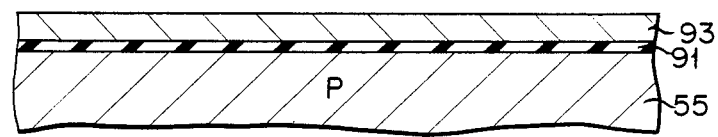
FIGS. 6A, 7A, 8A, 9A are cross sections along the line II—II of the device shown in FIG. 4 in one of the manufacturing stages.
Figure 6B:
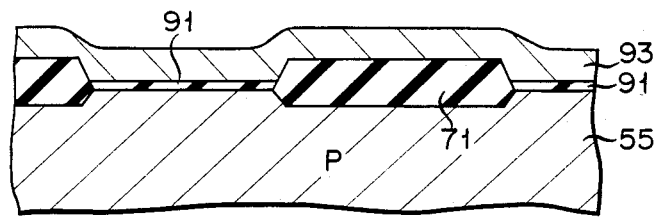
FIGS. 6B, 7B, 8B, 9B are cross sections along the line III—III of the device shown in FIG. 4 in the same manufacturing stage as in FIGS. 6A, etc.

As shown in FIGS. 6A and 6B, a field oxide film 71 approx. 600 nm thick is formed on the P type silicon substrate 55 by a selective oxide method, whereby the element region and the field region are isolated. An oxide film 91 approx. 50 nm thick is formed on the element region by thermal oxidation, for example. A polycrystalline silicon layer 93 is then formed over the whole surface of the wafer by a vapor-phase growth method.

Figure 7A:
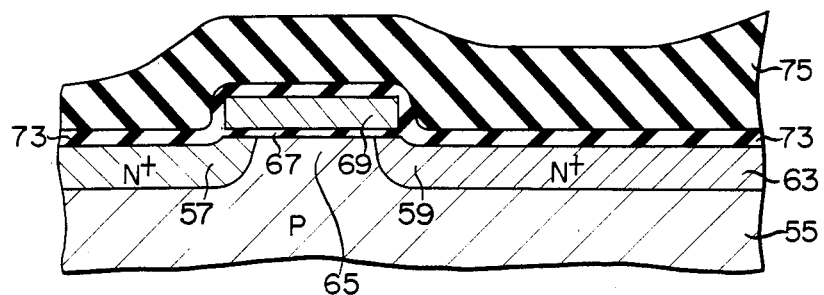
Figure 7B:
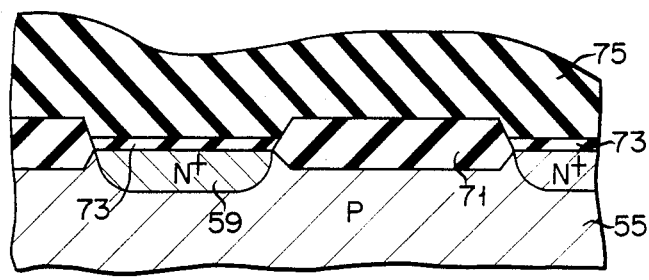

Next, as is shown in FIGS. 7A and 7B, polycrystalline silicon layer 93 is patterned by PEP (photo engraving process) to form gate electrode 69 and gate oxide film 67. An N type impurity, such as arsenic (As), is ion implanted, or dispersed, in the semiconductor substrate 55 using gate electrode 69 as a mask to form source 57 and drain 59. Then, the silicon oxide film 73 is formed over the whole surface of the wafer by thermal oxidation, for example, after which a low-temperature oxide film 75 is formed by CVD (chemical vapor deposition), for example.

Figure 8A:
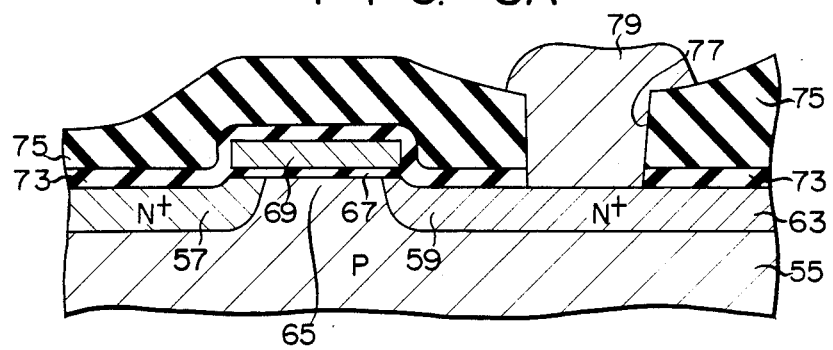
Figure 8B:
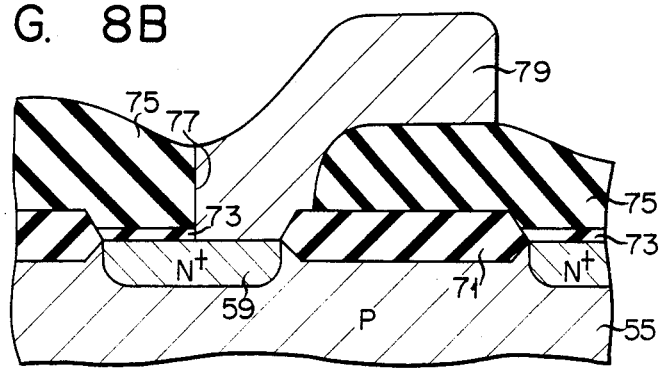

Next, as shown in FIGS. 8A, 8B, contact hole 77 is formed on drain 59 by PEP and a polycrystalline silicon layer 300 nm thick, for example, is depositied over the whole surface of the wafer by CVD. PEP is then used to carry out the patterning to form the electrode terminal layer 79. As is shown in FIG. 4, the planar shape of electrode terminal layer 79 substantially follows the shape of Al layer 85, and has a contact portion which extends only over the drain 59. This electrode terminal layer 79 may also be formed of polycrystalline silicon which includes phosphorous or arsenic. An electrode terminal layer 79, which does not include any impurities may be formed and phosphorous or arsenic may be dispersed or ion implanted after.

Figure 9A:
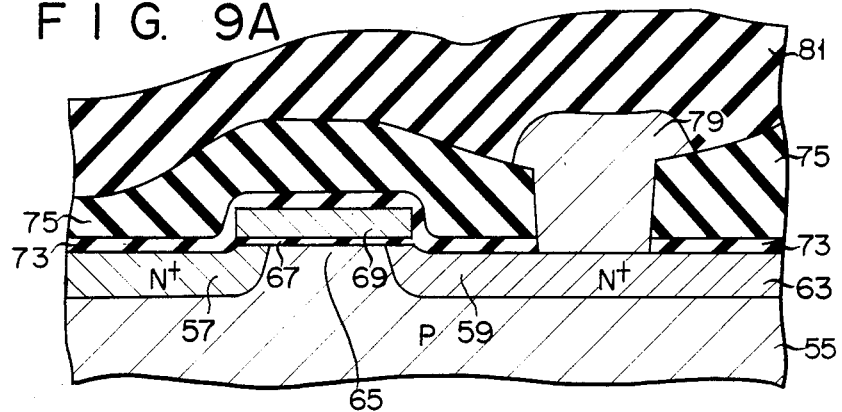
Figure 9B:
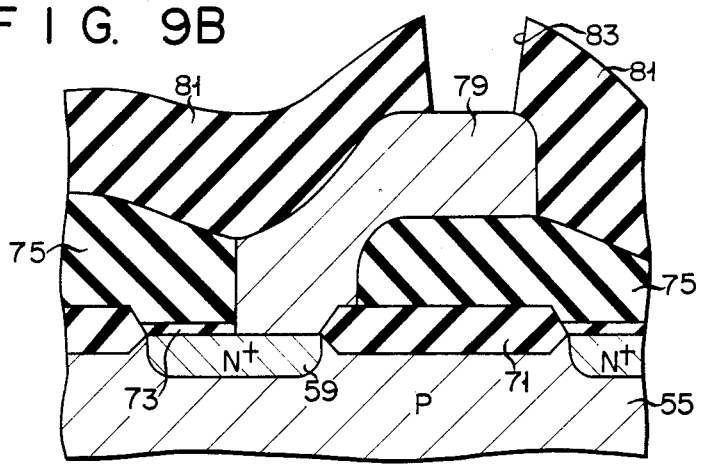

Next, as shown in FIGS. 9A and 9B, a low temperature oxide film 81 is formed over the whole surface by CVD, for example, and a contact hole 83 is formed in a prescribed position on the electrode terminal layer 79 of this low temperature oxide film 81.

Figure 5A:
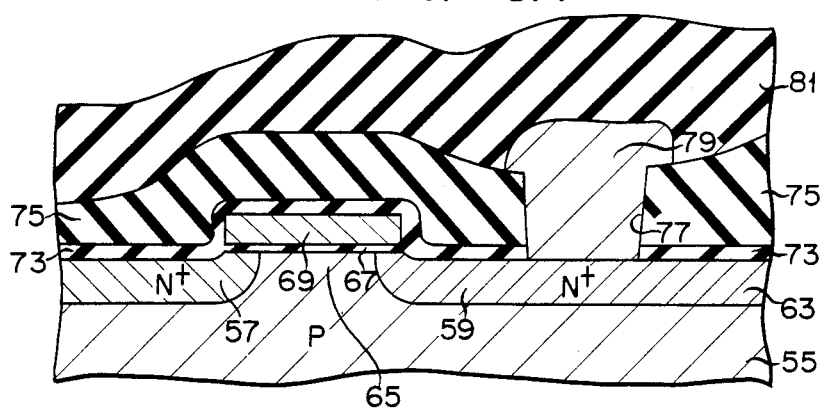
FIGS. 5A and 5B are cross sections of the device shown in FIG. 4 taken along the lines II—II and III—III.
Figure 5B:
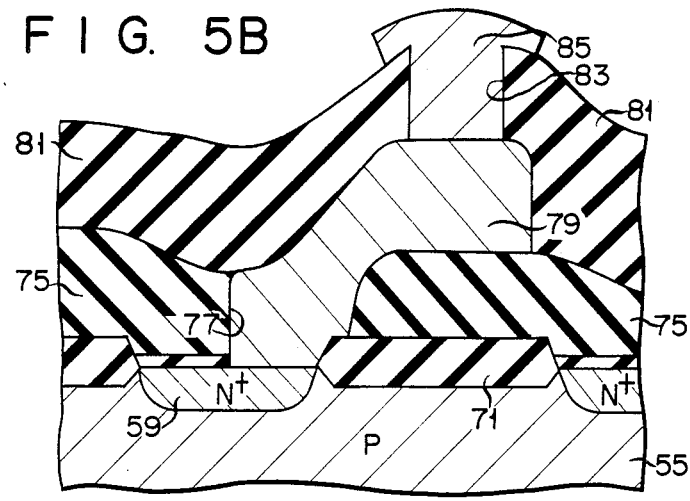

As shown in FIGS. 5A and 5B, an aluminum layer is vapour deposited over the whole wafer and patterned to form Al wire layer 85. Then, if necessary, boron B is ion implanted in the specified gate region 65 through the oxide layers 81, 75, 73, 67, and gate electrode 69 to write in data. Finally, a protective layer (not shown) is formed and the semiconductor memory device of this embodiment is complete. By suitably setting the conditions of the boron ion implantation, it is possible to carry out the implantation after the passivation film has been formed.

As was described above, in this embodiment the Al wire layer 85 is connected to the drain 59 by the electrode terminal layer 79 for the transmission of the output signals of the MOS transistor. The electrode terminal layer 79 and the Al wire layer 85 do not overlap the gate region 65 so it is possible to write in data by ion implantation after the formation of the Al wire layer 85 in the last stage of manufacturing of the semiconductor memory device. The result of this is that a read only memory device can be manufactured with a short turn-around time. Also, because the drain 59 and the electrode terminal layer 79 are in direct contact, the contact resistance is low and, accordingly, it is possible to decrease the size of the contact area of the electrode terminal compared to the prior art semiconductor memory device shown in FIG. 2.

With a reduction in chip size there is an improvement in yield because the smaller the chip, the lower the possibility of hitting a random fault. This therefore makes the device more economical. The size of the memory cell is not restricted by the gap between the contiguous Al wire layers 85 and, accordingly, in the end the area of the memory cell can be reduced by 80% over the prior art memory cell shown in FIG. 2. Consequently, it is possible to increase the degree of integration of the semiconductor memory device. The contact area of the electrode terminal layer 79 and the Al layer 85 can, except for over the gate region 65, be made sufficiently large.

Figure 1:
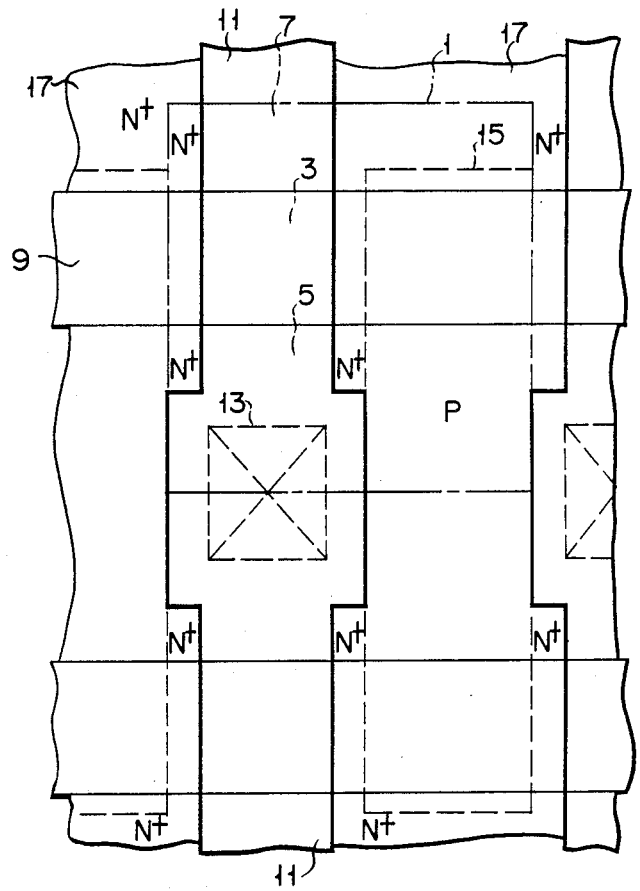
FIG. 1 is a plan view of the prior art read only semiconductor memory device.
Figure 2:
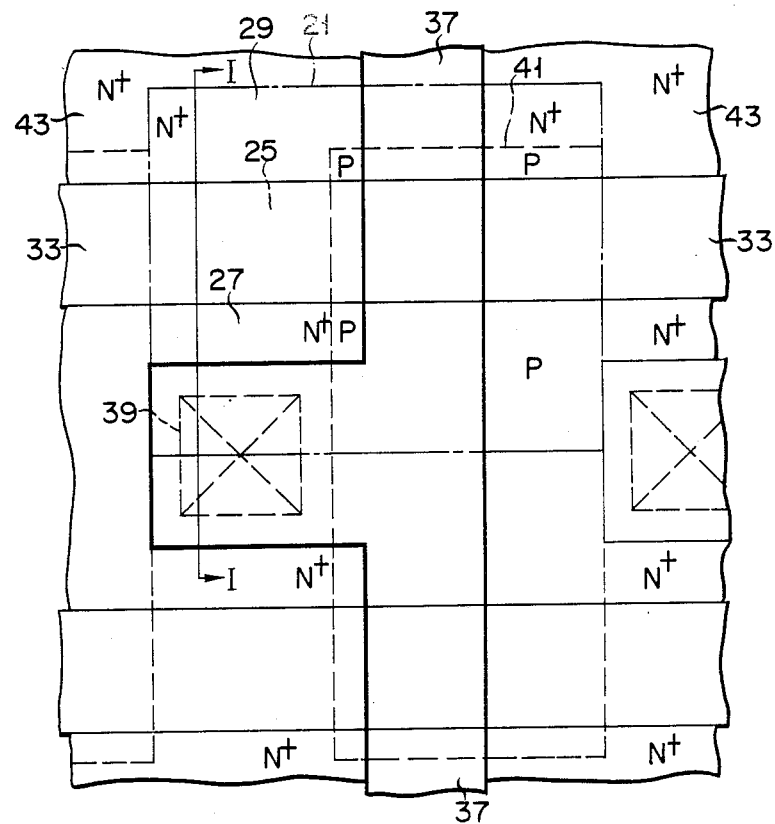
FIG. 2 is a plan view of an improved prior art read only semiconductor memory device.
Figure 3:
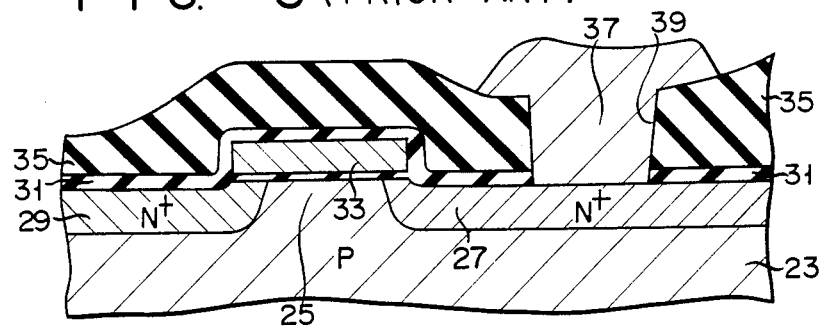
FIG. 3 is a cross section of the read only semiconductor memory device shown in FIG. 2.

Also, as was described above, the contact resistance value between the electrode terminal layer 79 and drain 59 can be decreased so the absolute value of the contact resistance can be reduced compared to the prior art device of FIG. 2. This means a reduction in the deterioration of the characteristics that are due to contact resistance. Accordingly, in this embodiment, a superior semiconductor memory device with high integration is possible.

In the above embodiment, the gate electrode 69 of the memory cell 51 is formed of polycrystalline silicon. This invention is not, however, restricted to this, and a high melting point silicide film such as molybdenum silicide $MOSi_2$ or a high melting point metal such as Mo, or either one of these combined with a two layer film of polycrystalline silicon is also within the realm of possibility.

The Al wire layer 85 is not limited to the form shown in FIG. 4 and may, for example, be formed such as the Al wire layer 37 shown in FIG. 2 where it projects over the drain 59.

The planar shape of the contact between drain 59 and the electrode terminal layer 79 and the contact between the electrode terminal layer 79 and the Al wire layer 85 are limited to the square shape shown in FIG. 4, but may be of any shape providing it does not overlap gate region 65.

In the above embodiment, the electrode terminal layer 79 and Al wire layer 85 were described as not overlapping the gate region 65 at all. The reason for this is that if there is a region which is not ion implanted, when data is written in by ion implanting the gate region 65, a leakage current may form. However, if there is no problem of a leakage current, it is possible for the electrode terminal layer 79 and Al wire layer 85 to partially overlap gate region 65.

In the above embodiment, an N channel MOS transistor was used in the description as the memory cell, but this invention is not limited to this; a P channel MOS transistor or a CMOS transistor may also be used.

What is claimed is:

1. A semiconductor memory device in which data is written by ion implanting in a gate region of a memory cell transistor to vary the threshold voltage, comprising:

a semiconductor body;

a MOS transistor, having a gate region, source region, drain region and gate electrode formed in said semiconductor body;

a field oxide film defining an element region of said semiconductor body;

a first insulation layer formed on said MOS transistor and having a first contact hole in a prescribed position extending to the drain region of said MOS transistor;

a polycrystalline silicon layer, formed over said MOS transistor except over at least a portion of the gate region of said MOS transistor, extending over said field oxide film, and filling the first contact hole, and directly contacting the drain region of said MOS transistor;

a second insulation layer formed covering at least said polycrystalline silicon layer and having a second contact hole in a prescribed position on said polycrystalline silicon layer, said second contact hole formed on a portion of said polycrystalline silicon layer over said field oxide film; and a metal wire layer formed over said MOS transistor except over at least a part of said gate of said MOS transistor, and connected to said polycrystalline silicon layer via said second contact hole to transmit output signals of said MOS transistor.

2. A semiconductor memory device according to claim 1, wherein said polycrystalline includes phosphorous (P).

3. A semiconductor memory device according to claim 1, wherein said polycrystalline includes arsenic (As).

4. A semiconductor memory device according to claim 1, wherein said polycrystalline silicon layer extends over said gate electrode and said wire layer contacts said polycrystalline silicon layer over at least said gate electrode.

5. A semiconductor memory device according to claim 1, wherein said wire layer is substantially straight.

6. A semiconductor memory device according to claim 1, wherein said polycrystalline silicon layer extends over said gate electrode, said wire layer contacts said polycrystalline silicon layer over at least gate electrode, and said wire layer is substantially straight.

* * * * *